United States Patent
Shin et al.

(10) Patent No.: US 7,888,683 B2
(45) Date of Patent: Feb. 15, 2011

(54) ORGANIC LIGHT EMITTING DISPLAY AND METHOD FOR MAKING THE SAME

(75) Inventors: Hey-Jin Shin, Suwon-si (KR); Won-Kyu Kwak, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/388,349

(22) Filed: Feb. 18, 2009

(65) Prior Publication Data

US 2009/0283774 A1 Nov. 19, 2009

(30) Foreign Application Priority Data

May 14, 2008 (KR) .................. 10-2008-0044454

(51) Int. Cl.
*H01L 29/04* (2006.01)
(52) U.S. Cl. .................. 257/72; 257/40; 257/48; 257/360; 257/E21.414; 257/E51.018
(58) Field of Classification Search .......... 257/72, 257/40, 48, 360, E21.414, E51.018
See application file for complete search history.

(56) References Cited

U.S. PATENT DOCUMENTS

| 7,145,356 B2 * | 12/2006 | Sang Gi .......... 324/769 |
| 2005/0024100 A1 | 2/2005 | Date et al. |
| 2006/0181259 A1 | 8/2006 | Sudoh et al. |

| 2008/0054798 A1 * | 3/2008 | Jeong et al. .......... 313/504 |

FOREIGN PATENT DOCUMENTS

| CN | 1928681 A | 3/2007 |
| JP | 2005-93459 | 4/2005 |
| JP | 2007-316105 | 12/2007 |
| KR | 1020060047938 A | 5/2006 |

OTHER PUBLICATIONS

KIPO Office action dated Jan. 4, 2010 for the corresponding Korean Priority Application No. 10-2008-0044454.
European Search Report dated Aug. 14, 2009, for corresponding European application 09160218.5, noting listed references in this IDS.
SIPO Office action dated Mar. 31, 2010, for corresponding Chinese Patent application 200910133576.4, with English translation, noting listed reference in this IDS.

\* cited by examiner

*Primary Examiner*—Long Pham
(74) *Attorney, Agent, or Firm*—Christie, Parker & Hale, LLP

(57) ABSTRACT

An organic light emitting display and a method for making the same includes protection circuitry to avoid damage from static electricity. The display and method allow performing a lighting test during display manufacturing. The organic light emitting display includes a substrate, a display region on the transparent substrate with a matrix of pixels, and a signal transfer unit on the transparent substrate for transferring lighting test signals to the pixels. The signal transfer unit includes transistors for transferring the lighting test signals and a resistor coupled to drains and gates of the transistors for protecting the transistors against damage from static electricity.

6 Claims, 6 Drawing Sheets

ORGANIC LIGHT EMITTING DISPLAY AND METHOD FOR MAKING THE SAME

CROSS-REFERENCE TO RELATED APPLICATIONS

This application claims priority to and the benefit of Korean Patent Application No. 10-2008-0044454, filed on May 14, 2008, in the Korean Intellectual Property Office, the entire content of which is incorporated herein by reference.

BACKGROUND OF THE INVENTION

1. Field of the Invention

The present invention relates to an organic light emitting display and a method for making the same.

2. Description of Related Art

Recently, various flat panel display devices that are reduced in weight and volume, in comparison to a cathode ray tube (CRT), have been developed. Types of flat panel display devices include liquid crystal display, field emission display, plasma display panel, and organic light emitting display.

The organic light emitting display displays an image using organic light emitting diodes (OLEDs) and generates light by recombination of electrons and holes generated corresponding to a flow of current. The organic light emitting display has excellent color reproducibility and a thin thickness. Organic light emitting displays often control flow of current to organic light emitting diodes using thin film transistors.

During manufacturing of an organic light emitting display, static electricity may be generated. If the static electricity is transferred to a thin film transistor in the display, the thin film transistor may be damaged and its properties are degraded, thereby causing failure or deterioration of image quality of the organic light emitting display. During organic light emitting display manufacturing it is often desirable to perform a lighting test to test operation of display pixels; however, damage from static electricity may interfere with the lighting test.

SUMMARY OF THE INVENTION

Aspects of embodiments of the present invention are directed toward an organic light emitting display and a method for making the same that forms a structure for preventing or reducing damage from static electricity during a manufacturing process, thereby protecting the display and facilitating a lighting test.

An embodiment of the present invention provides an organic light emitting display including: a substrate; a display region on the substrate, the display region including a plurality of pixels; and a signal transfer unit on the substrate for transferring lighting test signals to the plurality of pixels, wherein the signal transfer unit includes a plurality of transistors for transferring the lighting test signals, and a resistor coupled to drains and gates of the plurality of transistors for protecting the plurality of transistors.

Another embodiment of the present invention provides a method for making an organic light emitting display, the method including: patterning a semiconductor layer on a substrate to form channel regions; forming a first insulating film on the substrate and on the channel regions; patterning a first metal layer on the first insulating film to form gate metals; forming a second insulating film on the first insulating film and on the gate metals; and patterning a second metal layer on the second insulating film to form source-drain metals, wherein an end of the source-drain metals is coupled to an end of the gate metals.

Another embodiment of the present invention provides a method for making an organic light emitting display, the method including: patterning semiconductor layers on a substrate to form a first channel region and a second channel region; forming a first insulating film on the substrate and on the first and second channel regions; patterning a first metal layer on the first insulating film to form a first gate metal formed on the first channel region and a second gate metal formed on the second channel region, one end of the first gate metal being coupled to that of the second channel region; forming a second insulating film on the first insulating film and on the first and second gate metals; and patterning a second metal layer on the second insulating film to form source-drain metals, one end of the source-drain metals being coupled to that of the second channel region.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
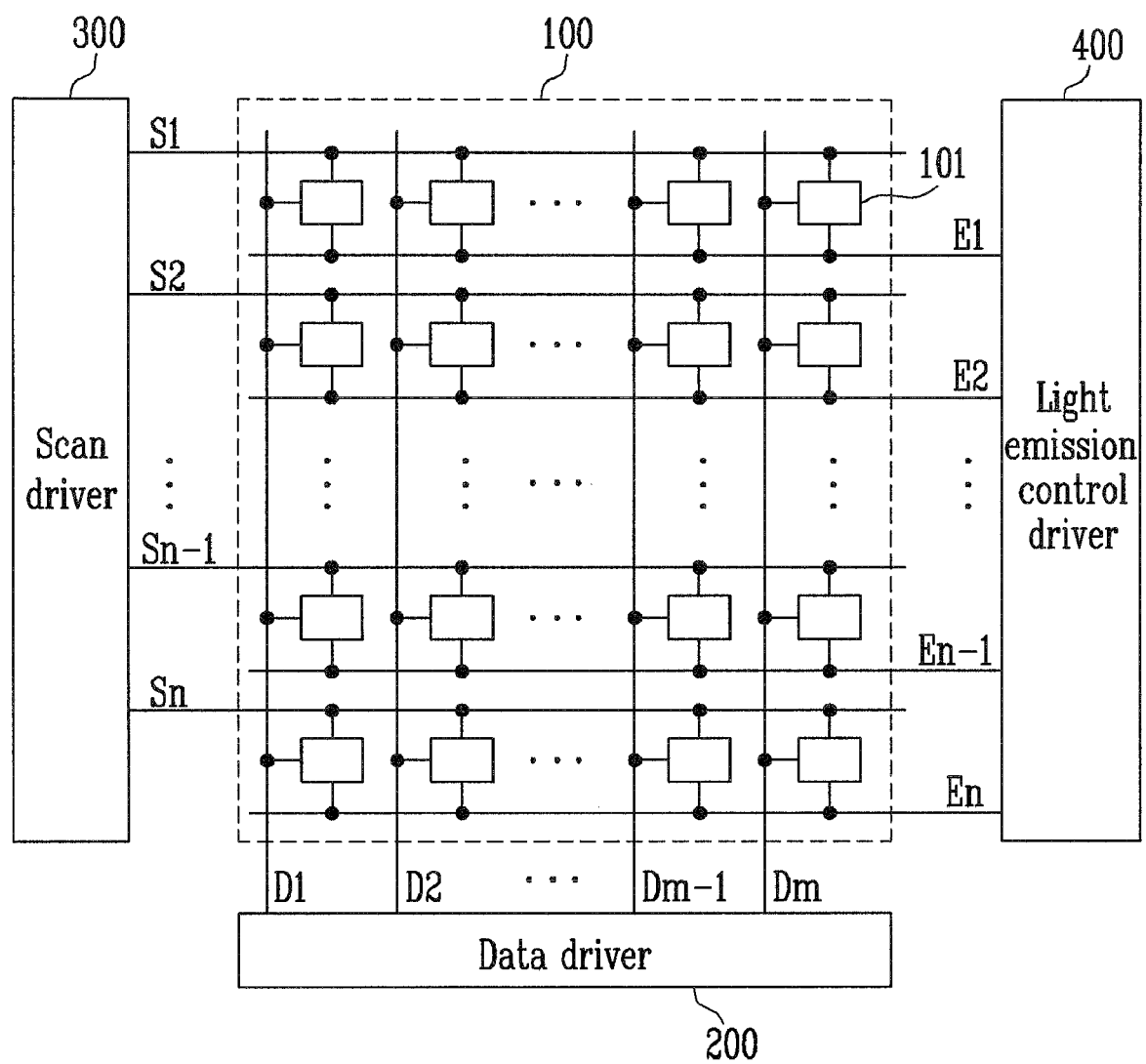
FIG. 1 is a schematic structural view of an organic light emitting display according to aspects of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when an element is referred to as being "on" another element, it may be directly on the another element or it may be indirectly on the another element with one or more intervening elements interposed therebetween. Also, when an element is referred to as being "coupled" to another element, it may be directly coupled to the another element or may be indirectly coupled to the another element with one or more intervening elements interposed therebetween.

FIG. 1 is a schematic structural view of an organic light emitting display according to aspects of the present invention.

Referring to FIG. 1, an organic light emitting display includes a display unit (or display region) 100, a data driver 200, a scan driver 300, and a light emission control driver 400.

The display unit 100 includes a plurality of pixels 101. Each pixel 101 includes an organic light emitting diode. The organic light emitting diode emits light corresponding to current flow in the diode. The display unit 100 has n scan lines S1, S2, . . . , Sn−1, and Sn extending in a row direction for transferring scan signals. The display unit 100 has m data lines D1, D2, . . . , Dm−1, and Dm extending in a column direction for transferring data signals.

The data driver 200 generates data signals from image signals having red, blue, and green (R, G, B) components. The data driver 200 applies the generated data signals to the data lines D1, D2, . . . , Dm−1, and Dm of the display unit 100. The data signals output from the data driver 200 may use multiplexing in order to reduce the number of output terminals of the data driver 200.

The scan driver 300 generates the scan signals and is coupled to the scan signals S1, S2, . . . , Sn−1, and Sn to transfer the scan signals to a specific row of the display unit 100. The scan signals are synchronized with the data signals output from the data driver 200 so that voltage corresponding to the data signals is transferred to the proper pixel 101.

The light emission control driver 400 generates light emission control signals and is coupled to light emission control lines E1, E2, . . . En−1, and En to transfer the light emission control signals to a specific row of the display unit 100. The pixel 101 is coupled to a corresponding light emission control signal so that driving current is generated corresponding to the voltage generated by the data signals. The generated driving current flows to the organic light emitting diode in the pixel 101.

Also, the display unit 100 receives a first power and a second power. The display unit 100 allows current to flow in the organic light emitting diode using the scan signals, the data signals, the light emission control signals, and the first power and second power to emit light, thereby displaying an image.

A lighting test is performed on the organic light emitting display in order to judge whether each pixel operates properly. The lighting test simply examines whether the pixel operates, thus data writing using the data driver 200 is not necessary. Therefore, the lighting test may be performed according to the structure shown in FIG. 2. By way of example, the lighting test may be performed before a data driver IC is mounted on the organic light emitting display.

Figure 2:
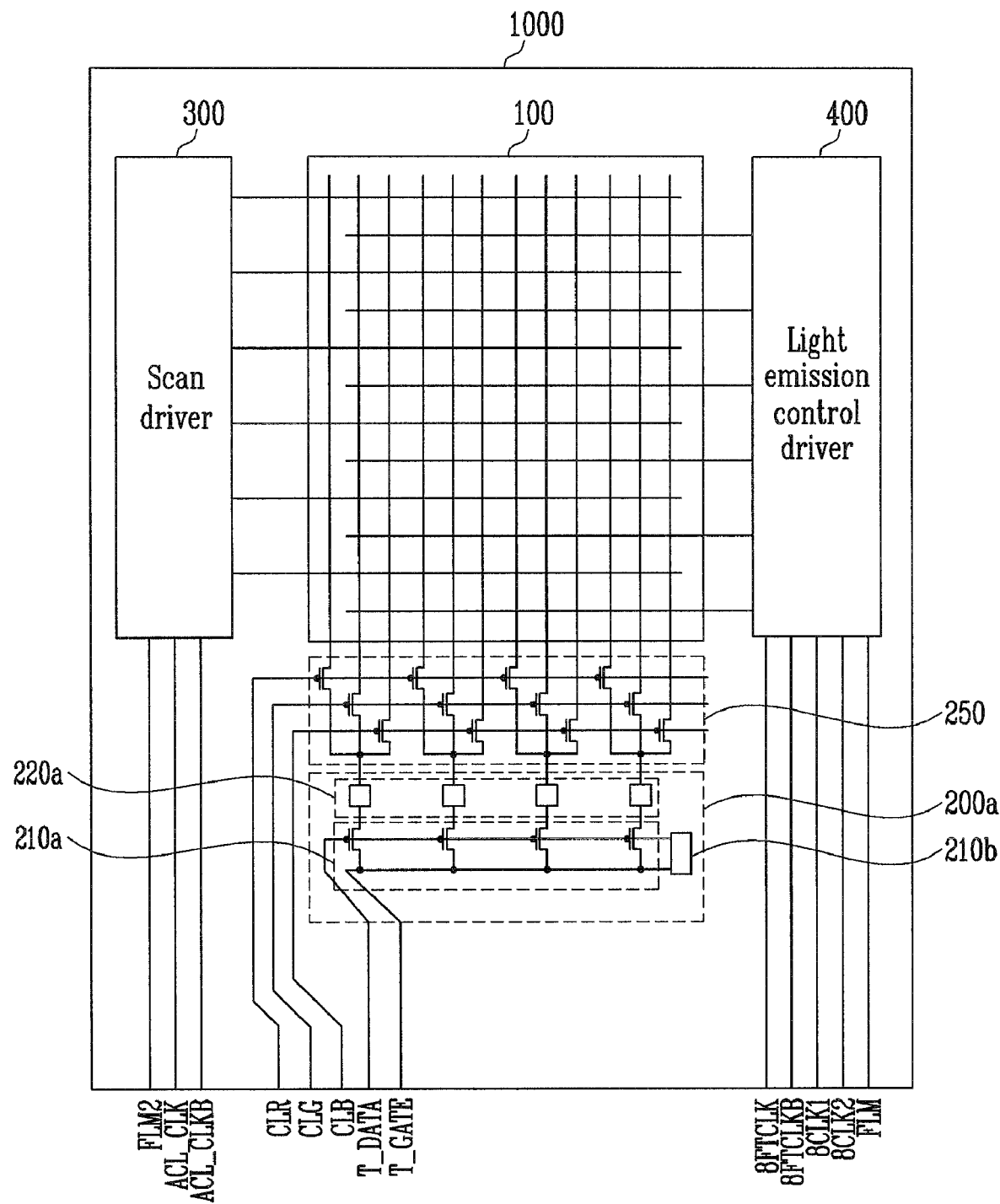
FIG. 2 is a schematic structural view of an organic light emitting display in a lighting test according to aspects of the present invention.

FIG. 2 is a schematic structural view of an organic light emitting display in a lighting test. Referring to FIG. 2, a display unit 100, a scan driver 300, and a light emission control driver 400 are on a transparent substrate 1000. The transparent substrate 1000 includes an IC region 200a. IC region 200a includes a plurality of terminals 220a to be coupled with pins of a data driver. Also, a multiplex unit 250 is between the display unit 100 and the IC region 200a so that three data lines are coupled to one of the plurality of terminals 220a in the IC region 200a through the multiplex unit 250. Other embodiments may not have a multiplex unit and thus have data lines coupled to the plurality of terminals without an intervening multiplex unit. Also, a plurality of wires for transferring signals for controlling the scan driver 300, the light emission control driver 400, and the multiplex unit 250 are included on the transparent substrate 1000 so that the signals are transferred to the scan driver 300, the light emission control driver 400, and the multiplex unit 250 from sources external to the substrate 1000. While the display unit 100 is depicted as having a very few signal lines for illustrative purposes, in practice, the display unit 100 would include many hundreds of the lines in both row and column directions, as those skilled in the art would appreciate. Of course, an appropriate number of driving circuits would be provided to drive such signal lines.

During the lighting test in one embodiment, the IC region 200a is a substantially vacant space since a data driver is not yet on the organic light emitting display. During the lighting test, a signal transfer unit for transferring lighting signals is in the IC region 200a. The signal transfer unit includes a plurality of transistors 210a for receiving lighting test signals from sources external to the display and transferring the lighting test signals to each pixel. The signal transfer unit also includes a protection unit 210b for reducing or preventing damage from static electricity. Although a single protection unit is shown in FIG. 2, some embodiments may use multiple protection units. The signal transfer unit is coupled to lighting test signals external to the display through wires.

After the organic light emitting display is implemented as described above, the scan driver 300, the light emission control driver 400, the multiplex unit 250, and the signal transfer unit are driven to perform a lighting text on the organic light emitting display.

The signal transfer unit on the transparent substrate 1000 is formed at the same time the display unit 100 is formed. That is, the display unit 100 and the signal transfer unit are formed on the transparent substrate 1000 through the same process. The scan driver 300 and the light emission control driver 400 may also be formed by the same process that forms the display unit 100 and the signal transfer unit.

The organic light emitting display may be subjected to static electricity during the manufacturing process, and the transistors 210a of the signal transfer unit and transistors of the display unit 100 may be damaged by the static electricity. If the display unit 100 is damaged, defects are generated in the product, and if the signal transfer unit is damaged, the lighting test cannot be performed. In order to avoid such problems, the protection unit 210b is formed in the signal transfer unit. The protection unit 210b protects the pixel and/or the signal transfer unit from static electricity transferred during the manufacturing process of the organic light emitting display.

Figure 3A:
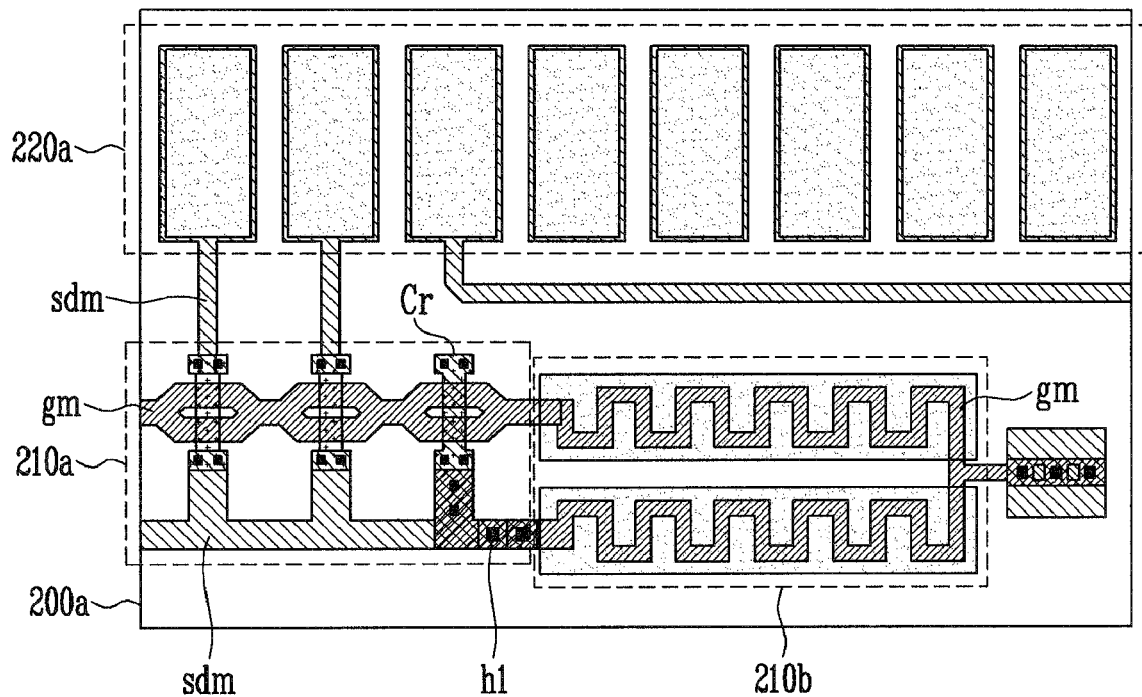
FIG. 3A is a structural view showing a signal transfer unit according to aspects of the present invention.
Figure 3B:
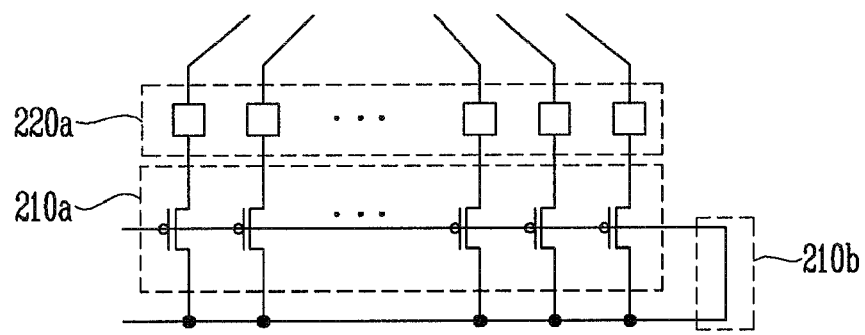
FIG. 3B is a circuit diagram of aspects of the signal transfer unit of FIG. 3A.
Figure 3C:
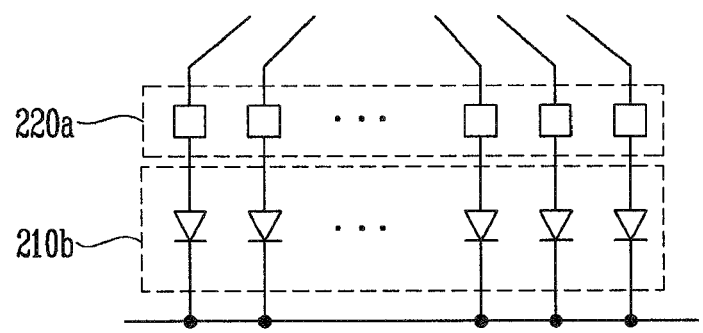
FIG. 3C is a further circuit diagram of aspects of the signal transfer unit of FIG. 3A.

FIGS. 3A, 3B, and 3C show aspects of an embodiment of the signal transfer unit. FIG. 3A shows structural aspects of the signal transfer unit. FIG. 3B shows a circuit diagram of the signal transfer unit. FIG. 3C show an equivalent circuit diagram of the signal transfer unit. Explaining FIG. 3A with reference to FIGS. 3B and 3C, a signal transfer unit includes a plurality of transistors 210a for transferring lighting signals and a protection unit 210b for protecting the plurality of transistors 210a and other elements from static electricity. The plurality of transistors 210a are coupled to a plurality of terminals 220a (to which a data driver is to be coupled after the lighting test) that are also coupled to data lines of a display unit 100. The protection unit 210b electrically connects drains and gates of the plurality of transistors 210a. A circuit as shown in FIG. 3B is formed. With the drains and gates of the transistors connected, the transistors are diode-connected so that they may be represented as shown in FIG. 3C.

Figure 6:
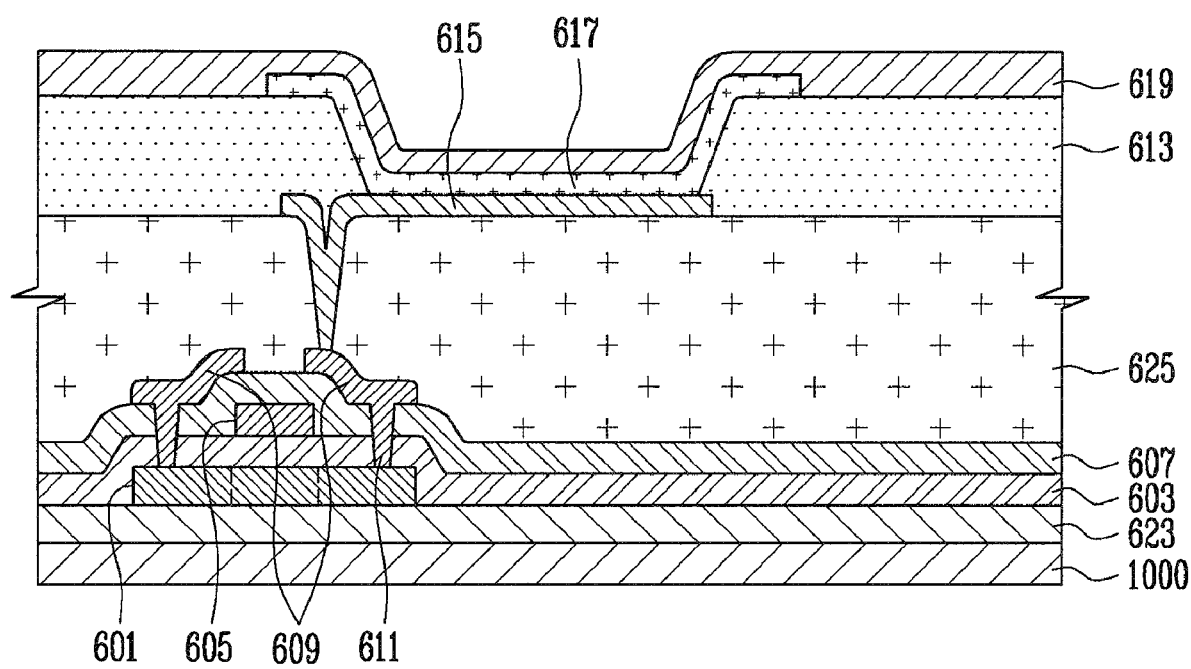
FIG. 6 is a cross-sectional diagram of aspects of an organic light emitting display according to aspects of the present invention.

A fabrication process of the pixels 101 of display unit 100 of FIGS. 1 and 2 will now be described with reference to FIG. 6. A semiconductor layer 601, for example, polysilicon, is formed and patterned over a buffer layer 623 on a substrate 1000 to create channel regions. A first insulating film 603 is formed thereon. A first metal layer 605 is then formed and patterned to create gate metals. A second insulating film 607 is formed on the gate metals. A second metal layer 609 is formed and patterned to create source-drain metals. Contact holes 611 are formed in the insulating films to couple the source-drain metals to the channel regions or to the gate metals. A planarization layer 625 is formed over source-drain metals and the second insulating film 607. A pixel definition film 613 is formed over the planarization layer 625. A transparent metal film 615, for example, ITO, is formed and patterned on the pixel definition film 613 to create anode electrodes. An organic light emitting layer 617 is formed on the anode electrodes and a cathode electrode 619 is formed over the organic light emitting layer 617.

In one embodiment, the signal transfer unit is formed through the same process used in the forming of the display unit 100. Referring to FIG. 3A, when the channel regions of thin film transistors of the display unit 100 are formed, channel regions cr of the transistors included in the signal transfer unit are also formed.

The first insulating film is formed on the channel regions cr. Gate metals gm are created on the first insulating film. The gate metals gm are gate electrodes of the transistors 210a. The protection unit 210b also includes gate metal gm. Gate metal of the protection unit 210b has a snake-like shape to allow length to be increased within a small area. Increased length increases resistance of the protection unit 210b. When the source-drain metals of the transistors of the display unit 100 are formed, source-drain metals sdm of the plurality of transistors 210a of the signal transfer unit are also formed. A contact hole h1 is formed in the second insulating film to couple the source-drain metals sdm to the gate metal gm forming the protection unit 210b. Thus, the structure and the circuit of the signal transfer unit as shown in FIGS. 3A and 3B are formed.

Figure 4A:
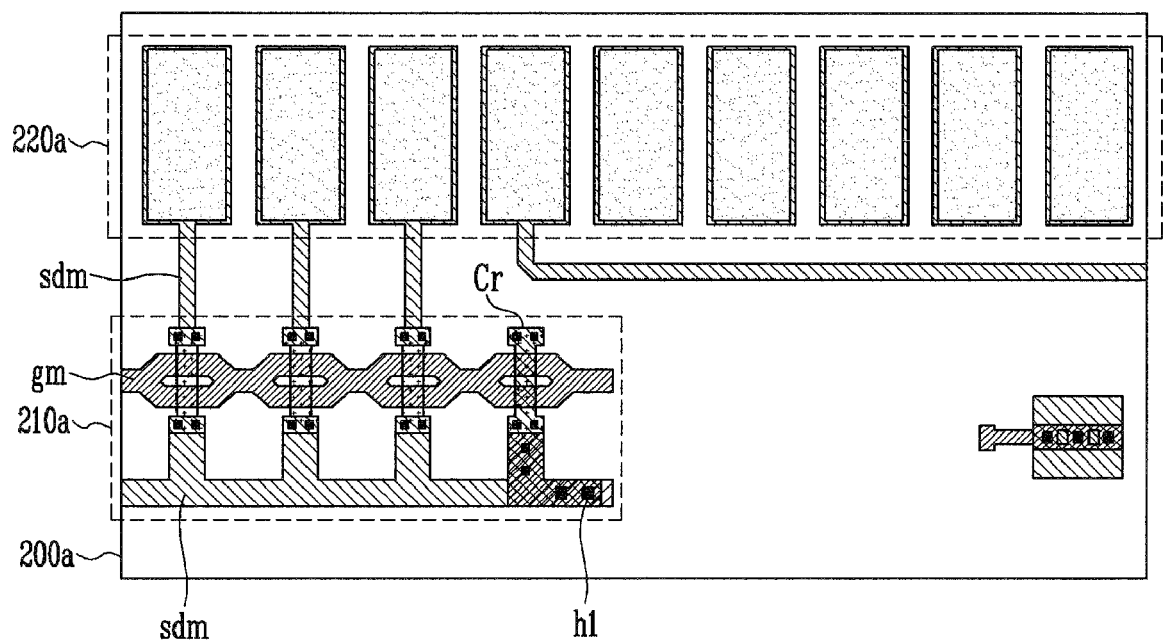
FIG. 4A is a further structural view showing a signal transfer unit according to aspects of the present invention.

When the anode electrodes of the display unit 100 are patterned through etching, the protection unit 210b of the signal transfer unit is removed through the etching process. Galvanic effect may be used for etching the anode electrodes and removing the protection unit 210b. After the removal of the protection unit 210b, the structure of the signal transfer unit becomes a structure as shown in FIG. 4A.

Figure 4B:
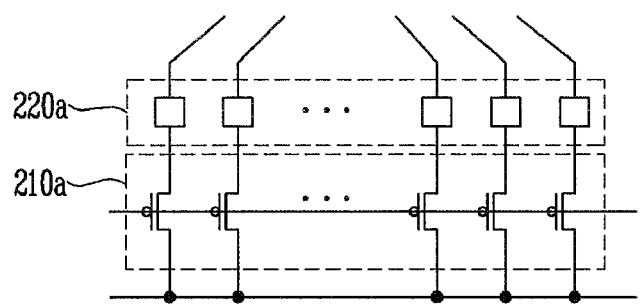
FIG. 4B is a circuit diagram of aspects of the signal transfer unit of FIG. 4A.

After the protection unit 210b is removed, the lighting test is performed. The signal transfer unit includes the transistors 210a as shown in FIG. 4B. Therefore, signals can be transferred to the display unit 100 from a source external to the organic light emitting display through the transistors 210a, making it possible to perform the lighting test.

The protection unit 210b of the signal transfer unit protects the display unit 100 and the plurality of transistors 210a of the signal transfer unit from being damaged by static electricity. The process by which the protection unit 210b reduces or prevents damage due to static electricity is as follows. If static electricity is transferred to the plurality of transistors 210a of the signal transfer unit, with the diode connection of the transistors, static electricity is not transferred to the pixels 101. Since the protection unit 210b is made of a conductive material, such as source-drain metal sdm and gate metal gm, static electricity is transferred to the source-drain metal sdm and the gate metal gm. When static electricity is high voltage, the second insulating film positioned between the source-drain metal sdm and the gate metal gm is burned off such that the metals are shorted together thereby dissipating the static electricity. Therefore, only the protection unit 210b is damaged by static electricity. Accordingly, the transistors 210a of the signal transfer unit are protected.

Figure 5A:
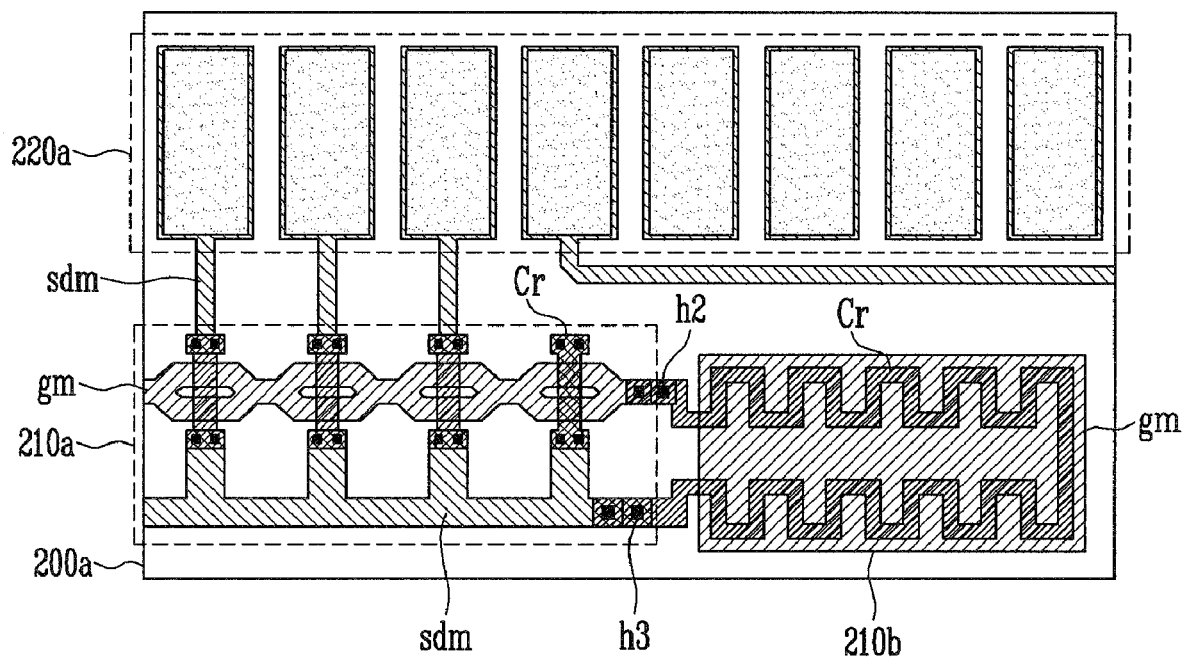
FIG. 5A is a structural view showing a signal transfer unit according to aspects of the present invention.
Figure 5B:
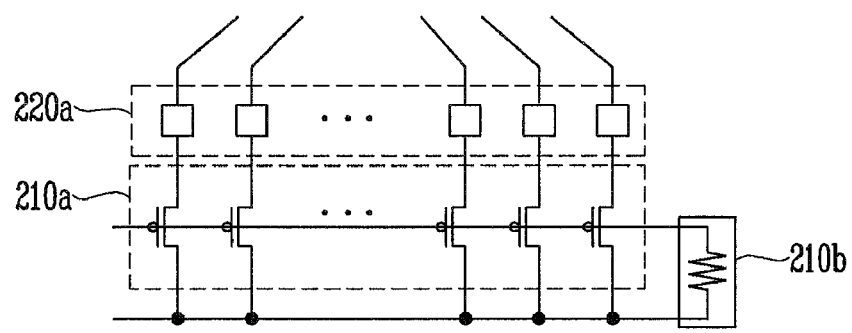
FIG. 5B is a circuit diagram of aspects of the signal transfer unit of FIG. 5A.

FIG. 5A is a structural view showing another embodiment of the signal transfer unit of FIG. 2, and FIG. 5B is a circuit diagram of the signal transfer unit of FIG. 5A. Referring to FIGS. 5A and 5B, the signal transfer unit includes a plurality of transistors 210a for transferring lighting test signals and a protection unit 210b for protecting the plurality of transistors and pixels. The protection unit 210b includes a resistor with the resistor coupled to the plurality of transistors 210a. When static electricity is transferred to the signal transfer unit, high voltage of the static electricity is dissipated by the resistor. At least one transistor of the plurality of transistors 210a of the signal transfer unit is a dummy transistor that functions to protect other transistors from being damaged by static electricity. Dummy transistors are not configured to transfer the lighting test signals.

The fabrication process of the plurality of transistors 210a and protection unit 210b of the signal transfer unit is now described. When channel regions of the thin film transistors of the display unit 100 are formed, channel regions cr of the plurality of transistors 210a and of the protection unit 210b of the signal transfer unit are also formed. The channel regions cr are formed of a semiconductor layer.

A first insulating film is formed on the channel regions cr. Gate metals gm are formed thereon. The gate metals gm become gate electrodes of the plurality of transistors 210a. A contact hole h2 is formed in the first insulating film to couple the protection unit to the gate metal gm. Likewise, the gate metal gm is formed for the protection unit 210b. After the gate metals gm are formed, an ion doping process is performed. Channel regions cr below gate metals gm are blocked from ion doping so that they remain intrinsic semiconductor regions. Therefore, the protection unit 210b has a high resistance value. For higher resistance value, the channel region of the protection unit 210b has a snake-like shape to allow length to be increased in a small area. When the source-drain metals sdm of the plurality of transistors 210a of the display unit 100 are formed, source-drain metals sdm of the transistors of the signal transfer unit are also formed. A contact hole h3 is formed in the second insulating film to couple the source-drain metals sdm to the channel regions cr forming the protection unit 210b. Therefore, as shown in FIG. 5B, the resistor is coupled in parallel with the plurality of transistors 210a of the signal transfer unit.

In this embodiment, the protection unit 210b is not removed while completing the display unit. The signal transfer unit is formed with the plurality of transistors 220b so that there is no need to remove the protection unit 210b.

The process of reducing or preventing damage due to static electricity by the protection unit 210b of the signal transfer unit will now be explained. If static electricity is transferred to the signal transfer unit, the static electricity is transferred to the resistor coupled to the plurality of transistors 210a of the signal transfer unit. Therefore, the static electricity is dissipated by the resistor, making it possible to reduce or prevent damage due to the static electricity.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display comprising:
   a substrate;
   a display region on the substrate, the display region comprising a plurality of pixels; and
   a signal transfer unit on the substrate for transferring lighting test signals to the plurality of pixels,
   wherein the signal transfer unit comprises a plurality of transistors for transferring the lighting test signals, and a resistor coupled to drains and gates of the plurality of transistors for protecting the plurality of transistors, the plurality of transistors comprising:
- channel regions on the substrate, the channel regions comprising a semiconductor layer;
- a first insulating film on the channel regions and the substrate;
- gate metals on the first insulating film, the gate metals comprising a first metal layer, wherein the gate metals are coupled to an end of the resistor;
- a second insulating film on the gate metals and the first insulating film; and
- source-drain metals on the second insulating film, the source-drain metals comprising a second metal layer, wherein the source-drain metals are coupled to the channel regions and coupled to another end of the resistor.

2. The organic light emitting display as claimed in claim 1, wherein the resistor comprises an intrinsic semiconductor.

3. The organic light emitting display as claimed in claim 1, wherein the resistor comprises the same semiconductor layer as the channel regions of the plurality of transistors.

4. The organic light emitting display as claimed in claim 1, wherein at least one transistor of the plurality of transistors is not configured for transferring the lighting test signals.

5. The organic light emitting display as claimed in claim 1, wherein a data driver is coupled to a region on the substrate where the signal transfer unit is positioned.

6. An organic light emitting display comprising:
- a substrate;
- a display region on the substrate, the display region comprising a plurality of pixels; and
- a signal transfer unit on the substrate for transferring lighting test signals to the plurality of pixels,
- wherein the signal transfer unit comprises a plurality of transistors for transferring the lighting test signals, and a resistor coupled to drains and gates of the plurality of transistors for protecting the plurality of transistors,
- wherein gate metals are on the resistor.

* * * * *